United States Patent [19]

Rischmuller

[11] Patent Number: 4,764,686
[45] Date of Patent: Aug. 16, 1988

[54] TRANSISTOR BASE CONTROL CIRCUIT FOR HIGH FREQUENCY OPERATION

[75] Inventor: Klaus Rischmuller, Aix en Provence, France

[73] Assignee: Thomson-CSF, Paris, France

[21] Appl. No.: 847,317

[22] Filed: Apr. 2, 1986

[30] Foreign Application Priority Data

Apr. 2, 1985 [FR] France .................................. 85 05010

[51] Int. Cl.⁴ ...................... H03K 17/60; H03K 3/26; H03K 3/33
[52] U.S. Cl. .................................. 307/254; 307/255; 307/270; 307/300
[58] Field of Search .......... 307/268, 254, 255, 252 R, 307/270, 246, 300

[56] References Cited

U.S. PATENT DOCUMENTS

| | | | |
|---|---|---|---|
| 3,300,072 | 3/1970 | Holtz | 307/252 W |
| 3,787,738 | 1/1974 | Horwath | 307/252 R |
| 4,032,834 | 6/1977 | Beierholm | 307/252 R |
| 4,239,989 | 12/1980 | Brajder | 307/300 |
| 4,472,642 | 9/1984 | Akamatsu | 307/252 R |

Primary Examiner—Stanley D. Miller
Assistant Examiner—B. P. Davis
Attorney, Agent, or Firm—Cushman, Darby & Cushman

[57] ABSTRACT

A switching control circuit for a power transistor is provided. For applying an initial negative base current for disabling of the power transistor, a capacitor is provided which stores the energy required by charging not only when the power transistor is enabled but also when it is disabled. The capacitor discharges through a circuit for a time fixed by the time constant of a series RC network; this time is chosen of the order of time required for destoring the charges of the power transistor.

5 Claims, 1 Drawing Sheet

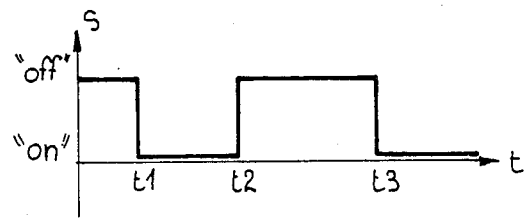
FIG_1
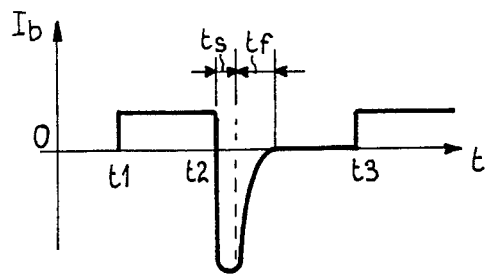
FIG_2
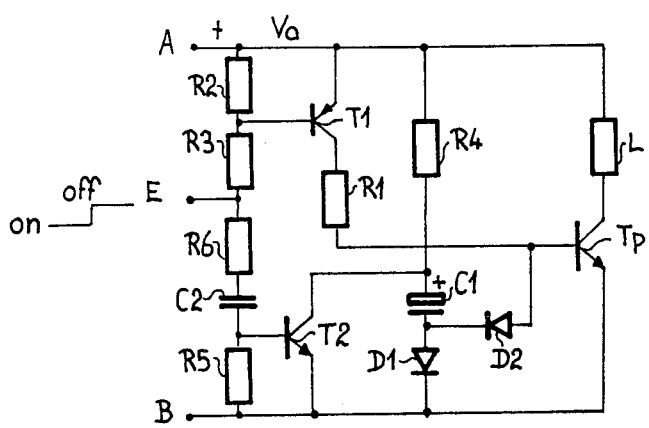
FIG_3
FIG_4
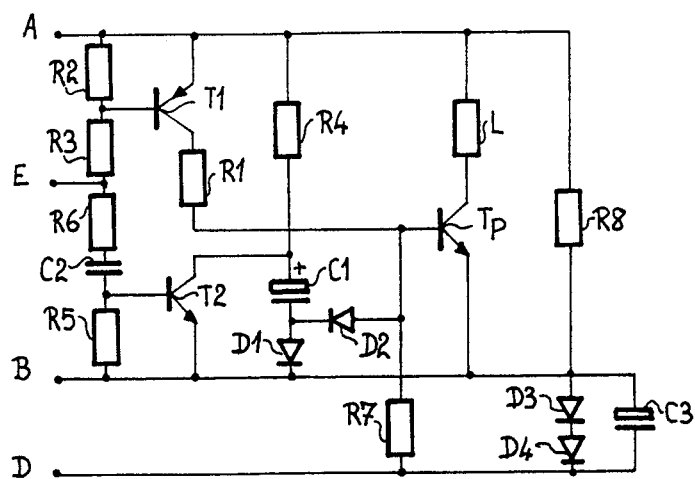

TRANSISTOR BASE CONTROL CIRCUIT FOR HIGH FREQUENCY OPERATION

BACKGROUND OF THE INVENTION

1. Field of the Invention

The present invention relates to the switching control of power transistors at high frequencies, for example in the 10 to 100 KHz range.

2. Description of the Prior Art

If we consider a switching order signal S (FIG. 1) which passes from a first state or "off" state, in which the power transistor is disabled, to a second state or "on" state in which the power transistor is enabled, and rapid switching from one state to the other is desired, it is known that the base current Ib of the transistor should have the form shown in FIG. 2. As can be seen in FIG. 2, the base current Ib must be of a first polarity when the transistor is to be enabled. By convention the current which enables the transistor will be called hereafter positive base current; this convention corresponds to a current entering the base for an NPN power transistor. To cause the signal S to pass from the on state to the off state, it is not sufficient for the base current Ib to be at zero, but rather a reverse polarity current (which will be called negative base current by convention) must be initially extracted from the base. This negative current is absolutely necessary if rapid switching of the transistor from the enabled state to the disabled state is desired. In fact, only such a negative base current can eliminate fairly rapidly the electric charges which have accumulated in the base of the transistor during the conduction period. The negative base current is substantially constant during a time ts following the disabling order (destorage time), and then it comes back to zero during a time tf (fall time).

A priori, in order to give the base current this general shape or trend, two supply sources of opposite polarities must be available. This is an obvious disadvantage and so efforts have been made to construct circuits capable of supplying the negative base current without a negative supply source. For that purpose a capacitor or inductance is generally used which stores the energy for the enabled period of the transistor and restores it in the form of a negative base current at the moment when the order for disabling the transistor is initiated.

However, most of the circuits constructed up to now suffer from an important drawback: in order for the circuit to operate suitably, the capacitor or inductance must have the time to store sufficient energy during the enabled time. This means that the enabled time must have a minimum value which is not too small.

If the switching period is low (high frequency operation), this minimum value becomes a very large fraction of the switching period and the circuit can no longer be operated with a low cyclic conduction ratio, that is to say with a low ratio between the conduction time and the switching time.

SUMMARY OF THE INVENTION

The present invention provides a new control circuit for enabling and disabling a power transistor which, while being very simple and using only a small number of components, overcomes this drawback.

The circuit of the invention comprises, as in the known technique, a control input connected to an enabling circuit and to a disabling circuit, the enabling circuit delivering to the power transistor a positive or zero base current depending on the state of the control input, and the disabling circuit delivering first of all an initial negative base current on reception of a disabling order at the control input then a zero base current.

Moreover, in accordance with the invention, the disabling circuit comprises the following elements:

a capacitor for storing the energy required for producing a negative base current;

a means for charging the capacitor during the enabled period and during the disabled period of the power transistor;

a controlled switch for establishing a circuit for discharge of the capacitor in the base of the power transistor, the current flowing through this discharge circuit on closure of the switch corresponding to a negative base current;

a control circuit for the temporary closure of the switch, this circuit controlling the closure of the switch as soon as a disabling order is received at the control input and for a short predetermined time which is of the order of size of the time for destoring the power transistor.

In a preferred embodiment of the invention, the capacitor has a first plate connected on the one hand to a charging means and on the other to the emitter-collector circuit of a switching transistor, and a second plate connected to a first diode oriented in one direction so that the capacitor may be charged by the charging means during the whole of the time that the switching transistor is disabled. A second diode is connected between the base of the power transistor and a second plate of the capacitor and is oriented in a direction allowing a negative base current to pass through a discharge circuit formed by the base of the power transistor, the second diode, the capacitor and the switching transistor (when this latter is enabled); finally, the circuit controlling the temporary closure of the switch comprises a series assembly of at least one resistor and a capacity, this assembly forming a series RC network connected to the control input so that the capacity may receive a charging current when the input receives a control signal for disabling the power transistor; the series RC assembly is further connected to a control terminal of the switching transistor, for, on the one hand, transmitting instantaneously a signal for enabling the switching transistor, on reception of a control signal for disabling the power transistor and, on the other hand, for beginning at the same time to apply a charging current to the capacity of the RC network, and finally for interrupting the enabling of the switching transistor after a time determined by the charging time constant of the capacitor of the RC network, this time being of the order of the time required for destoring the charges in the power transistor.

BRIEF DESCRIPTION OF THE DRAWINGS

Other features and advantages of the invention will be clear from reading the detailed description which follows, with reference to the accompanying drawings in which:

FIGS. 1 and 2, already described, represent timing diagrams of the control signal applied to the input of a power transistor control circuit and the base current which must result therefrom;

FIG. 3 shows a preferred embodiment of the invention; and

FIG. 4 shows a variant of construction.

DESCRIPTION OF THE PREFERRED EMBODIMENTS

The circuit of the invention is shown in its preferred embodiment in FIG. 3.

The power transistor is designated by the reference Tp. The control input of the circuit is E. The whole of the circuit is fed across two supply terminals A and B one (B) of which may be formed by an electric ground and the other (A) at a positive supply potential Va.

The transistor Tp selectively allows or prevents the passage of a current through a load L connected between its collector and a positive supply potential which may be the potential Va. The emitter of transistor Tp is preferably connected to the ground B.

For applying a positive base current, an enabling circuit is provided; for applying a negative base current, a disabling circuit is provided; these two circuits are connected to the input E which controls them.

The enabling circuit here comprises the following elements: a PNP transistor T1 having its emitter connected to the terminal A and its collector connected through a resistor R1 to the base of transistor Tp. The base of transistor T1 is connected to the middle point of a divider bridge R2, R3 which is connected between the terminals A and E. Depending on whether the voltage level at input E is low (enabling order for transistor Tp) or high (disabling order), transistor T1 applies a current or interrupts the current in the base of transistor Tp.

The enabling circuit is therefore very simple and could moreover be replaced by other circuit variants such as a simple current source connected between terminal A and the base Tp, this source being controlled by terminal E.

The disabling control circuit comprises the other elements of FIG. 3, namely:

a capacitor C1 which serves for storing the energy required for producing a negative base current, for discharging to provide the stored charges at the beginning of the disabled period of transistor Tp;

a resistor R4 and a diode D1 which serve for charging capacitor C1, a switch, formed here by an NPN transistor T2; this switch establishing a discharge circuit for the capacitor C1 when closed, a circuit for controlling the switch, comprising two resistors R5, R6 and capacitor C2;

and finally a diode D2 connected between the base and capacitor C1 and having several functions mentioned below.

More precisely, the elements of the circuit are connected in the following way: diodes D1 and D2 are in series (and have the same polarity) between the base of transistor TP and terminal B; the junction point between the diodes is connected to a plate of the capacitor C1; the other plate of this capacitor is connected through the resistor R4 to terminal A and is further connected to the collector of the switching transistor T2; the emitter of transistor T2 is connected to terminal B; the base of transistor T2 is connected to a terminal of capacity C2 and to a terminal of resistor R5; the other terminal of resistor R5 is connected to ground B; the other terminal of capacity C2 is connected through resistor R6 to the control input E.

The circuit operates in the following way: for enabling, input E is brought to a low potential, which on the one hand enables transistor T1 and applies a positive base current to the power transistor Tp which begins to conduct and, on the other hand, discharges capacity C2 through the resistors R5 and R6 with a time constant (R5+R6)C which is short (of the order of the time required for destoring the transistor Tp). The discharge time for capacity C2 may be reduced to an even lower value by further providing one or two diodes in parallel across resistors R5 and R6, the diode being connected so as to allow removal of the charge of capacity C2 when input E is brought to the low potential. During this time, capacitor C1 charges or more exactly continues to charge if its charge has already begun before the enabling signal, which will very often be the case, except perhaps for cyclic conduction ratios close to unity. C1 charges through R4 and D1.

For disabling the transistor Tp, input E is brought to a high potential. This results in immediately disabling transistor T1 and so interrupting the positive base current. Furthermore, the high potential level serves for immediately biasing the transistor T2 into a conducting state, the ratio of resistors R5 and R6 being chosen so that the voltage applied to the base of transistor T2 is a sufficient fraction of the potential present between terminals A and E. In this connection it will be recalled that capacity C2 is initially discharged. Under these conditions, transistor T2 essentially a short circuit condition and establishes a circuit for discharging the capacitor C1. Since transistor T1 is disabled and since diode D1 is oriented in a direction allowing charging but not discharging of the capacitor C1, the discharge current can only come from diode D2 and, in the form of a negative base current, from the base of transistor Tp.

While capacitor C1 is thus discharging and allowing the flow of the charges stored in the base of the transistor, capacitor C2 charges through resistor R6. After a certain time, depending on the charging time constant of the capacitor and on the value of the high potential applied to input E, the base of transistor T2 will no longer receives a current sufficient for maintaining transistor T2 in the enabled state. This latter therefore is disabled (progressively) and the negative base current, after gradually decreasing, is completely interrupted.

The time constant for charging the capacity C2 (through resistor R6 and the parallel assembly of resistor R5 and the base-emitter junction of transistor T2) is chosen so that interruption of the conduction of transistor T2 and so interruption of the negative base current takes place after a time which is of the order of size of the time ts or ts+tf (FIG. 2); the ideal is to approximate as closely as possible, by a higher value, this time ts+tf, whose order of size is a few microseconds.

For safety's sake, a time constant substantially greater than ts+tf will be chosen for a given transistor assumed to switch under normal conditions; a value of 2(ts+tf) seems reasonable.

As soon as transistor T2 is disabled, i.e. at the end of a very short time with respect to the switching period, capacitor C1 again begins to charge through resistor R4 and diode D1.

It is important to note that capacitor C1 is recharged while the power transistor Tp is disabled; charging of C1 continues moreover for all the rest of the disabled time and also during the whole of the enabled time which follows.

The triple role of diode 2 in this circuit is as follows.

During the major part of the disabled period (i.e. after the transitory phase when the base current is negative) diode D2 prevents a positive base current from being applied to the base of transistor Tp following charging of capacitor C1 (if a direct connection existed between the capacitor C1 and the base, the current for charging C1 could pass through the base of transistor Tp and enable it while still in the disabled phase).

During the phase when a negative base current is to be produced, because of its orientation diode D2 allows this negative current to pass.

Finally, during the conduction phase, diode 2 with the help of diode D1 ensures a sufficient bias voltage (two forward diode voltage drops) between the base and emitter of transistor Tp.

FIG. 4 shows a variant in which the base of the power transistor is to be polarized negatively with respect to the emitter for the whole disabled time; this is the case in particular when several transistors are mounted as a bridge.

With respect to the diagram of FIG. 3, the main difference is that terminal B no longer forms a supply terminal but only a node of the circuit. The supply terminal is a terminal D and a resistor, two diodes and a capacitor (in the example shown) are added: more precisely, a resistor R7 connects the base to the second supply terminal D; a resistor R8 connects terminal A to node B; two series diodes D3 and D4 connect the node B (anode side) to the terminal D (cathode side) and a capacitor C3 is placed in parallel across the diodes D3 and D4 between the terminals B and D. Capacitor C3 charged by resistor R8 keeps between the terminals B and D a constant potential difference limited by the diodes to a value of about 1.3 V. Through the resistor R7 this potential difference is applied to the base-emitter junction of transistor Tp, the base potential being then negative with respect to the emitter potential.

Other variants are possible without departing from the scope and spirit of the invention. In particular, the circuit controlling the base of transistor T2 may be constructed differently provided that it ensures the above defined function, namely the immediate biasing of transistor T2 into an enabled state on transition of the signal applied to input E, then disabling of transistor T2 after a time which is very short but sufficient for destoring the charges of the power transistor Tp.

It should be further noted that it is only by way of example that a low potential level was chosen for the enabling "on" signal and a high level for the disabling "off" signal.

What is claimed is:

1. A switching control circuit for a power transistor, which has a control input for receiving at least one of a turn-on control signal and a turn-off control signal, said control input being connected to a turn-on control circuit and to a turn-off control circuit, the turn-on control circuit selectively delivering a base current to a base of the power transistor depending on a signal on said control input, and the turn-off control circuit selectively delivering an initially non-zero reverse biased base current on reception of said turn-off control signal on said control input and then a zero base current, said turn-off control circuit comprising:

capacitor means for storing energy;

switch means, coupled to said capacitor means, for selectively altering a current path of said capacitor means, causing discharge of said capacitor means into said base of said power transistor as said non-zero reverse biased base current in a first state;

means for charging said capacitor means, said switch means enabling charging of said capacitor means in a second state; and switch control means, connected to said switch means, for controlling said state of said switch means, said first state controlled upon reception of said turn-off control signal on the control input and during a short predetermined time after that, said predetermined time being of an order of magnitude of a time necessary for removing charges previously stored in the base of the power transistor when in the conductive state, and said second state being controlled at other times.

2. The switching control circuit for a power transistor as claimed in claim 1 further comprising a first diode, wherein said capacitor means has a plate connected to said first diode oriented in one direction for allowing the capacitor means to charge when said switch means is in said second state.

3. The switching control circuit for a power transistor as claimed in claim 2, further comprising a second diode, connected between said plate and the base of the power transistor, and oriented in a direction allowing a negative base current to pass through the discharge circuit formed by the base of the power transistor, the second diode, the capacitor means and the switch means.

4. The switching control circuit for a power transistor as claimed in claim 2, wherein said switch means is a transistor with an emitter-collector connected in parallel across the series assembly of said capacitor means and said first diode.

5. The switching control circuit for a power transistor as claimed in claim 1, wherein said switch control means comprises a series assembly of at least one resistor and one capacitor, connected between the control input and a supply terminal and further connected to a control terminal of said switch means, so that said switch means instantaneously assumes said first state on reception of a disabling order at the control input and remains in said first state until the charge in the capacitor, begun on reception of the disabling order, has reached a value corresponding to opening of the switch means, the charging time constant of said capacitor being chosen so that a time a of said first state the switch is of the order of the time required for discharging the power transistor.

* * * * *